United States Patent
Conn et al.

(10) Patent No.: US 7,362,121 B1
(45) Date of Patent: Apr. 22, 2008

(54) SELF-HEATING MECHANISM FOR DUPLICATING MICROBUMP FAILURE CONDITIONS IN FPGAS AND FOR LOGGING FAILURES

(75) Inventors: Robert O. Conn, Los Gatos, CA (US); Steven J. Carey, San Jose, CA (US); Siuki Chan, Cupertino, CA (US); William H. Pabst, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 793 days.

(21) Appl. No.: 10/860,237

(22) Filed: Jun. 2, 2004

(51) Int. Cl.
*G01R 31/02* (2006.01)
(52) U.S. Cl. ....................................... 324/765
(58) Field of Classification Search ............... None
See application file for complete search history.

(56) References Cited

U.S. PATENT DOCUMENTS

| | | | | |
|---|---|---|---|---|
| 5,795,068 A * | 8/1998 | Conn, Jr. | ............... | 374/170 |
| 6,002,991 A * | 12/1999 | Conn, Jr. | ............... | 702/117 |
| 6,150,863 A * | 11/2000 | Conn et al. | ............... | 327/270 |
| 6,466,520 B1 * | 10/2002 | Speyer et al. | ............... | 324/617 |
| 6,611,477 B1 * | 8/2003 | Speyer et al. | ............... | 324/617 |
| 6,631,503 B2 * | 10/2003 | Hsu et al. | ............... | 716/4 |
| 6,895,566 B1 * | 5/2005 | Chan et al. | ............... | 716/4 |
| 7,084,487 B1 * | 8/2006 | Conn | ............... | 257/660 |
| 7,138,820 B2 * | 11/2006 | Goetting et al. | ............... | 326/9 |
| 7,230,445 B1 * | 6/2007 | Goetting et al. | ............... | 326/9 |
| 7,233,061 B1 * | 6/2007 | Conn | ............... | 257/686 |
| 7,235,999 B2 * | 6/2007 | Goetting et al. | ............... | 326/9 |
| 2005/0242836 A1 * | 11/2005 | Goetting et al. | ............... | 326/39 |

OTHER PUBLICATIONS

Maxim Integrated Products; "Dual Remote/Local Temperature Sensors and Four-Channel Voltage Monitors"; 2001 Copyright Maxim Integrated Products; available from Maxim at www.maxim-ic.com; pp. 1-18.

* cited by examiner

*Primary Examiner*—Jermele Hollington
(74) *Attorney, Agent, or Firm*—T. Lester Wallace

(57) ABSTRACT

A system replicates the rapid temperature increases that are believed to cause microbump failures in certain applications of programmable logic devices (PLDs). The system configures a PLD under test with a circuit that switches a large amount of current and generates a large amount of heat when the circuit is clocked. The system monitors the temperature of the PLD and controls the switching of the circuit to achieve a predetermined temperature within a predetermined time period. The PLD is cooled, and the thermal cycling is repeated. The system detects microbump failures and communicates failure data to a computer for logging and analysis.

22 Claims, 5 Drawing Sheets

SELF-HEATING MECHANISM FOR DUPLICATING MICROBUMP FAILURE CONDITIONS IN FPGAS AND FOR LOGGING FAILURES

FIELD OF THE INVENTION

The present invention relates to programmable logic devices, and more particularly to devices and methods for detecting failures in programmable logic devices.

BACKGROUND INFORMATION

Programmable logic devices (PLDs), such as field-programmable gate arrays (FPGAs), are user-programmable integrated circuits that can be programmed to implement user-defined logic circuits. In a typical FPGA architecture, an array of configurable logic blocks (CLBs) and a programmable interconnect structure are surrounded by a ring of programmable input/output blocks (IOBs). The programmable interconnect structure comprises interconnects and configuration memory cells. Each of the CLBs and the IOBs also includes configuration memory cells. The contents of the configuration memory cells determine how the CLB, the IOB and the programmable interconnect structure is configured. FPGAs are often flip-chip mounted in ceramic integrated circuit packages and sold as packaged FPGAs.

High performance FPGAs (for example, the Virtex-II Pro FPGA available from Xilinx Inc. of San Jose Calif.) have been observed to fail in the field in certain applications. FPGAs have been observed to fail following periods of high processing throughput in, for example, telecommunications and networking applications. In these applications, communications traffic handled by devices containing FPGAs is at time high and at other times low.

A device and method is sought for identifying the cause of failures in FPGAs that are used in applications involving periods of high processing throughput.

SUMMARY

A system for testing microbump failures in flip-chip mounted PLDs replicates the rapid temperature increases that are believed to cause microbump failures in certain applications of PLDs. The system configures each PLD under test with a circuit that switches a large amount of current and generates a large amount of heat when the circuit is clocked. The system also configures each PLD such that pairs of microbumps are connected together. In one example, a first IOB outputs a test signal through a first microbump and onto a trace of a printed circuit board so that a second IOB can receive the test signal through a second microbump.

The system monitors the temperature of each PLD and self-heats each PLD by switching a plurality of digital logic elements in the PLD. The self-heating causes the rate of thermal ramp to be much greater than in a conventional thermal cycle test in an oven. The system monitors the temperature of each PLD and controls the switching of the plurality of digital logic elements to achieve a predetermined temperature within a predetermined time period. Each PLD is cooled, and the thermal cycling is repeated.

The system detects a failure in at least one of each first microbump and each second microbump by detecting that the test signal is not received by the associated second IOB. The system can detect microbump failures in up to 150 PLDs and communicates failure data to a computer for logging and analysis. The system detects microbump failures in commercially produced FPGAs rather than in devices specifically made for testing.

A method for self heating PLDs and detecting microbump failures caused by thermal cycling involves configuring a PLD such that a first IOB outputs a test signal through a first microbump and such that a second IOB can receive the test signal through a second microbump. The method involves monitoring the temperature of the PLD and generating heat in the PLD by switching a plurality of digital logic elements in the PLD. A predetermined temperature is achieved in the PLD within a predetermined time period by controlling the switching of the plurality of digital logic elements. The method includes detecting a failure in at least one of the first microbump and the second microbump by detecting that the test signal is not received by the second IOB.

Additional embodiments and novel aspects are also described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

In the following description, numerous specific details are set forth to provide a more thorough understanding of the present invention. However, it will be apparent to one skilled in the art that the present invention can be practiced without these specific details.

Figure 1:
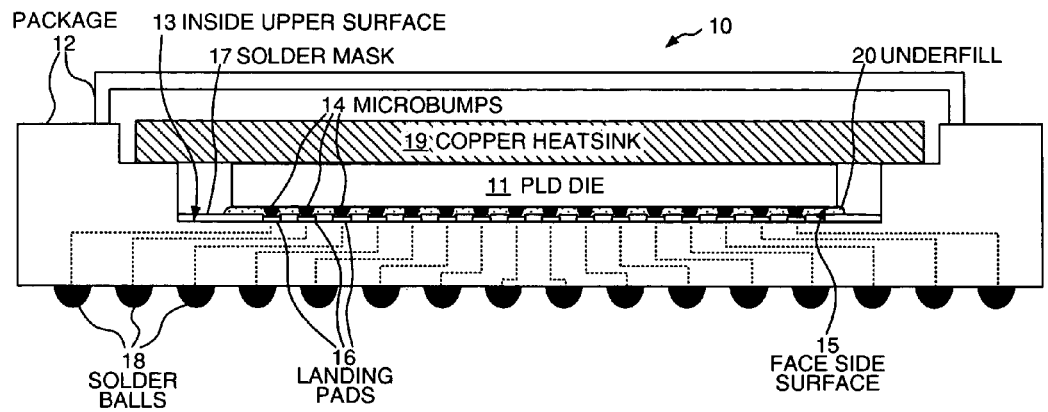
FIG. 1 is a simplified cross-sectional diagram of a programmable logic device (PLD) flip-chip mounted in a ball grid array package.

FIG. 1 is a simplified cross sectional diagram of an assembly 10 including an integrated circuit die 11 mounted in a ball grid array (BGA) package 12. In this example, package 12 is a 1500-pin BGA package. Die 11 is a programmable logic device (PLD) die that is mounted face-side down on an inside upper surface 13 of package 12 in a flip-chip manner. The term "face side" used here denotes the side of the die that receives the bulk of semiconductor processing such that circuitry is fabricated on that face side of the die. Microbumps 14 are present in an array on a bottom face-side surface 15 of PLD die 11. Each microbump 14 is approximately 100 microns in diameter and is made of solder. Each microbump in the array of microbumps 14 contacts a corresponding landing pad in an array of landing pads 16 on inside upper surface 13 of package 12. A solder mask 17 covers inside upper surface 13 between landing pads 16. The circuitry of PLD die 11 is coupled through package 12 to a printed circuit board (not shown) via solder balls 18 on the bottom surface of package 12.

PLD die 11 is a high-performance field programmable gate array (FPGA) capable of high processing throughput. PLD die 11 consumes more power as processing throughput increases. When power consumption of PLD die 11 increases quickly, for example, during a burst of high processing throughput, the heat generated by circuitry on PLD die 11 also increases quickly. A copper heatsink 19 is stacked on top of PLD die 11 in order to absorb heat generated by PLD die 11. Even with heatsink 19, however, the temperature of PLD die 11 increases quickly in applications involving high processing throughput.

An increase in temperature of PLD die 11 causes the die to increase in size. The temperature of inside upper surface 13 of package 12, however, does not increase at the same rate. Moreover, PLD die 11 and upper surface 13 of package 12 likely have different temperature coefficients. Therefore, there is a lateral movement of face side surface 15 of PLD die 11 relative to inside upper surface 13 of package 12. The lateral movement puts stress on microbumps 14. An underfill material 20 is placed between PLD die 11 and inside upper surface 13 of package 12 to absorb some of the stress. Underfill material 20 is added from the side after PLD die 11 has been flip-chip mounted in package 12. Nevertheless, significant stress is carried by microbumps 14.

Figure 2:
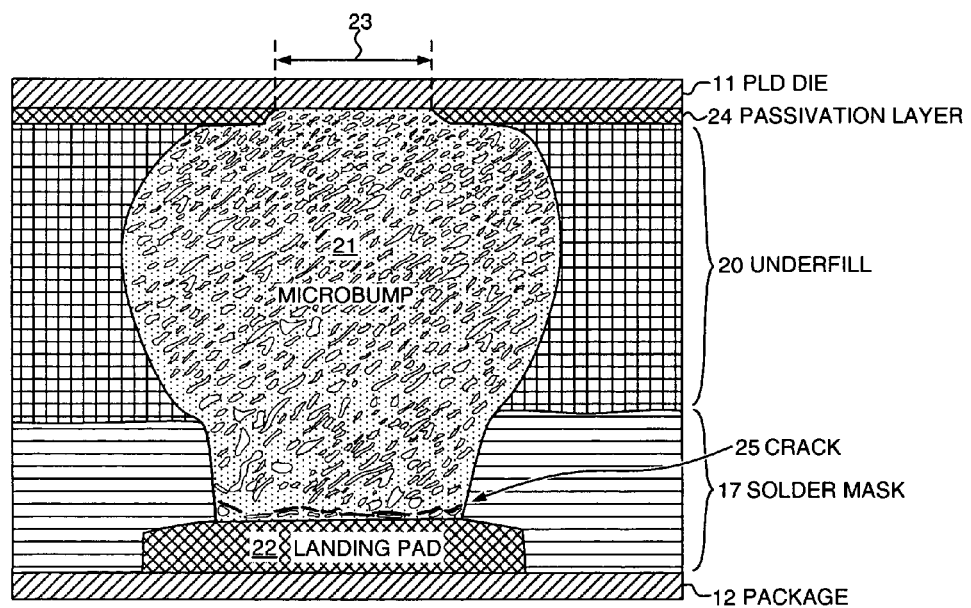
FIG. 2 is a detailed, cross-sectional view of a microbump between the PLD and the package of FIG. 1.

FIG. 2 shows a detailed, cross sectional view of a microbump 21 that has absorbed stress from lateral movement within assembly 10. Microbump 21 illustrates one of microbumps 14 that has failed. Solder mask 17 partially covers landing pad 22 such that a somewhat cylindrical hole is formed above landing pad 22. Solder paste is heaped in and over the hole in solder mask 17. PLD die 11 is then placed over package 12, and assembly 10 is heated. Microbumps 14 on bottom face-side surface 15 of PLD die 11 melt. Microbump 21 is formed when the solder paste in the hole melts and merges into one of the melted microbumps 14. Microbump 21 contacts face-side surface 15 of PLD die 11 through an opening 23 in a passivation layer 24 adjacent to face-side surface 15.

The solder of microbump 21 is a mixture of lead and tin. Areas of lead are shown as lighter areas in FIG. 2. A crack 25 has formed horizontally towards the bottom of microbump 21. A horizontal lead-rich layer has formed just below crack 25. The areas of lead in microbumps that have failed are observed to be finer and more directional than in microbumps that have not failed. FIG. 2 shows that the areas of lead are somewhat directional in a diagonal orientation, with the exception of the horizontal lead-rich layer below crack 25. Microbumps near other microbumps used for power (Vcc) are observed to fail more often than do other microbumps, perhaps due to the larger temperature fluctuations around the power microbumps.

Stress on microbumps appears to be more pronounced in PLDs than in other integrated circuits. Consider, for example, a specific high-throughput application that causes PLD die 11 to generate heat. In a telecommunications application, PLD die 11 may be sitting relatively idle. Much of the circuitry of PLD die 11 may not be switching rapidly or switching at all. The power consumption of PLD die 11 is therefore relatively low, and the temperature of PLD die 11 is near the ambient temperature. Then, a sudden burst of telecommunications traffic is received by PLD die 11 for processing. A large amount of the circuitry of PLD die 11 starts switching to perform the processing, and the temperature of PLD die 11 increases rapidly. The temperature of PLD die 11 can increase 60 degrees Celsius (C) within a matter of a couple of seconds. The rapid increase in temperature causes thermal expansion within PLD die 11 and relative lateral movement between PLD die 11 and package 12. The lateral movement puts stress on microbumps 14.

The telecommunications traffic may then disappear, and the temperature of PLD die 11 decreases. Then another burst of telecommunications traffic appears, and the cycle of rapidly increasing die temperature repeats. The repeated stressing of microbumps in this telecommunications application of an FPGA is not typically present in most applications of other integrated circuits, such as microprocessors. A microprocessor typically performs a certain amount of background processing and idle loop instruction fetching, even in periods of relative inactivity. Moreover, microprocessors are presently often smaller than the most advanced FPGAs, and the consequential smaller lateral movement between a microprocessor die and its package creates less stress on the microbumps. Thus, the microprocessor does not usually experience the rapid thermal expansion problems observed in some FPGA applications. For these reasons, it is believed that microbump failures following thermal cycling are being observed first in large FPGAs. In the future, however, microprocessor dice will likely increase in size, and the problem of cracking microbumps may increase in flip-chip mounted microprocessors.

The precise cause of microbump failures following thermal cycling, however, must still be studied and confirmed. A contributing factor in the failure mechanism may, for example, involve maintaining a microbump at an elevated temperature. At a low temperature, the solder of the microbump may be able to absorb the stress of lateral movement fairly well without cracking or breaking. If the solder is maintained for an extended period at a sufficiently high temperature, however, then the crystalline structure of the solder can slowly change such that the solder becomes more brittle. An example of such a sufficiently high temperature has been observed to be about 105 degrees C. for fifteen minutes. Such brittle solder is more likely to crack when subjected to stress following a rapid temperature increase of an FPGA. The failure mechanism that results in cracked microbumps may, therefore, involve some component of maintaining the solder of the microbumps at some predetermined elevated temperature for some predetermined time period.

Another contributing factor in the failure mechanism that results in cracked microbumps may involve a reduction in the stress-transferring capacity of underfill material 20 at elevated temperatures. At a certain glass transition temperature, the stress transferring capacity of underfill material 20 may begin to degrade. For example, a reduced stress-transferring capacity has been observed at 85 degrees C. Maintaining assembly 10 at an elevated temperature may cause a degrading of the stress transferring capacity of underfill material 20 and thereby increase the amount of stress placed on microbumps 14.

To aid in the continued study of the precise cause of microbump failures following thermal cycling, a system and method are disclosed that reproduce the thermal cycling experienced in certain high-throughput applications and that also detect the occurrence of such microbump failures. By better understanding the precise cause of microbump failures, a means of preventing the failures can better be achieved.

Figure 3:
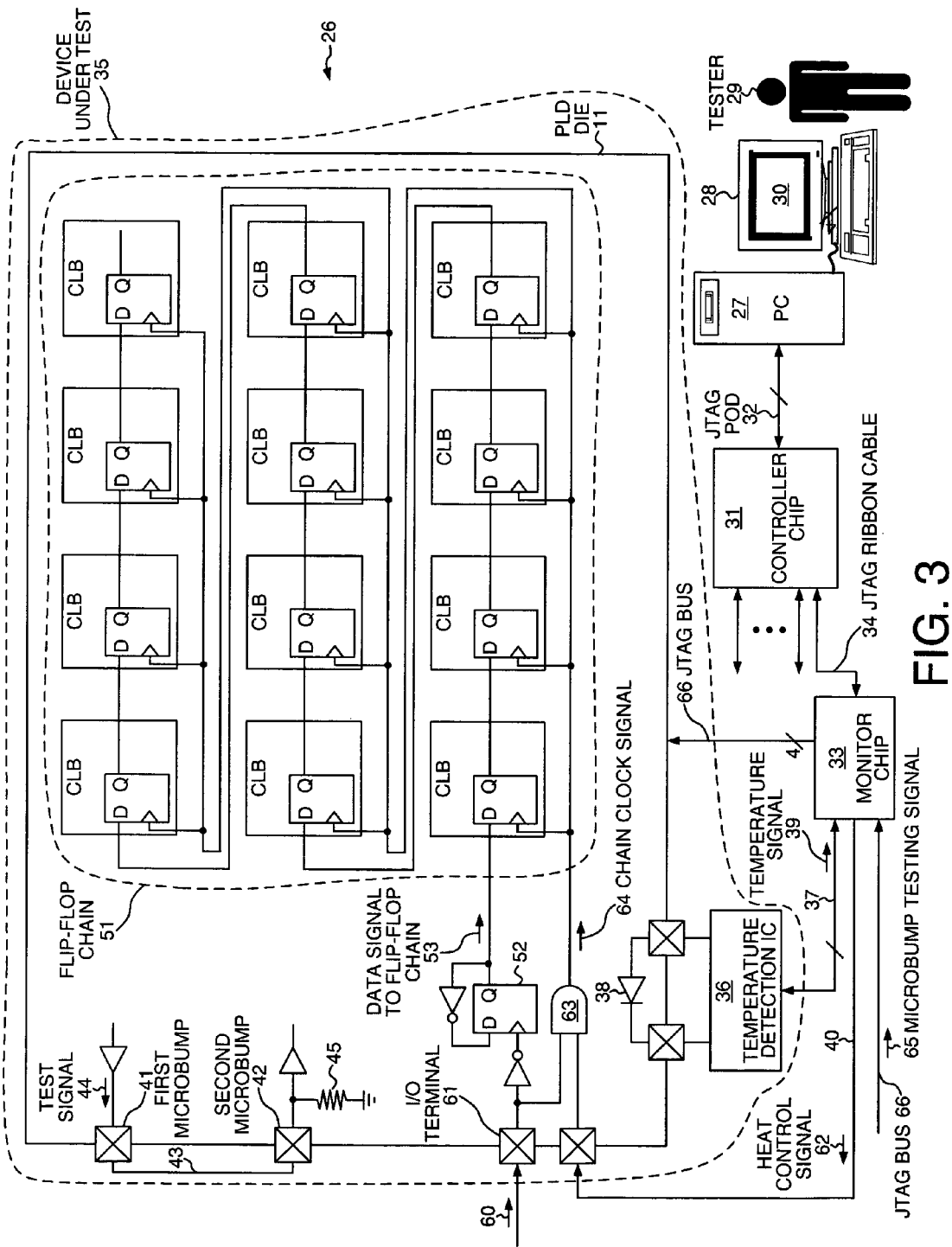
FIG. 3 is a simplified circuit diagram of a system for self-heating multiple PLDs and for detecting microbump failures.

FIG. 3 shows a system 26 for self-heating multiple PLD dice to replicate the rapid temperature increases and thermal cycling that are believed to cause microbump failures in certain real-world applications. System 26 causes the failure of microbumps by heating the PLDs using electrical energy of the supply current received by the PLDs. In addition to subjecting multiple PLDs to thermal cycling that puts stress on microbumps, system 26 detects and logs microbump failures in the PLDs.

System 26 includes a personal computer (PC) 27 with a monitor 28. Data describing the detected microbump failures can be viewed by tester 29 on a graphical user interface 30 displayed on monitor 28. PC 27 is coupled to a controller chip 31 by a Joint Test Action Group (JTAG) pod 32. Controller chip 31 is, in turn, coupled to a monitor chip 33 by a JTAG ribbon cable 34. Controller 31 controls up to fifteen monitor chips, including monitor chip 33. Each monitor chip controls ten devices under test (DUTs). In this example, monitor chip 33 controls DUT 35. DUT 35 includes PLD die 11 and a temperature detection integrated circuit 36, such as a temperature detecting IC, e.g., Part Number MAX6655 from Maxim Integrated Products, Inc of Sunnyvale, Calif. Temperature detection IC 36 detects and reports the temperature of PLD die 11 to monitor chip 33 via a temperature bus 37. Temperature detection IC 36 uses a diode 38 in PLD die 11 to detect the temperature of PLD die 11. The temperature data are transmitted in a temperature signal 39 to monitor chip 33 and ultimately to controller chip 31. Monitor chip 33 is coupled to PLD die 11 via heat control line 40.

Each PLD is disposed on a printed circuit board so that corresponding pairs of input/output terminals are connected by a trace on the printed circuit board and so that a failure of one of the I/O terminals can be detected. PLD die 11 has an array of microbumps on its bottom face-side surface, and each I/O terminal in FIG. 3 includes a microbump. PLD die 11 is configured such that an output I/O terminal comprises a first microbump 41, and an input I/O terminal comprises a second microbump 42. First microbump 41 is connected to second microbump 42 external to PLD die 11 through a trace 43 on a printed circuit board. PLD die 11 is programmed to drive a test signal 44 in the form of a digital high through first microbump 41 out onto trace 43. If neither of first microbump 41 and second microbump 42 has failed (and there is a connection between the output I/O terminal and the input I/O terminal), then the digital high of test signal 44 will be received on the input I/O terminal. If either of first microbump 41 or second microbump 42 (or both) has failed and forms an open, however, then an internal pull-down resistor 45 coupled to second microbump 42 will cause test signal 44 not to be received and input I/O terminal to read a digital low.

Figure 4:
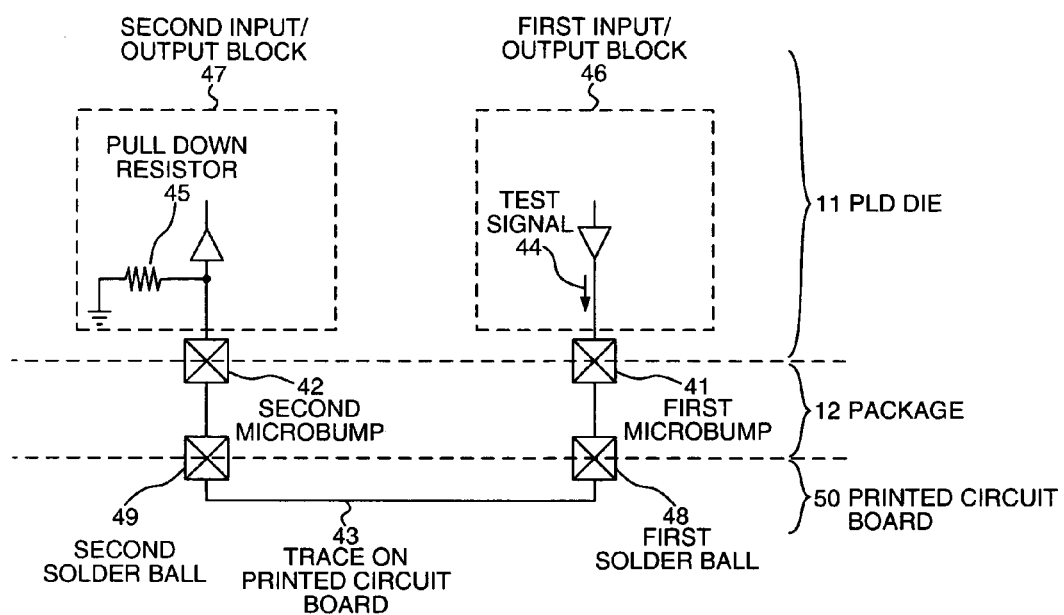
FIG. 4 is a diagram showing a portion of the system of FIG. 3 surrounding first and second microbumps.

FIG. 4 shows an area around first microbump 41 and second microbump 42 in more detail. First microbump 41 and second microbump 42 are coupled to user-configurable input/output blocks (IOBs) within PLD die 11. Each IOB controls one I/O terminal and associated microbump and can be configured for input, output or bi-directional signals. In contrast to a typical application specific integrated circuits (ASIC), in which I/O terminals are typically designed to have a dedicated function, an I/O terminal of a PLD can typically be configured to be an output, an input or both. The PLDs of the DUTS are therefore configured such that pairs of their I/O terminals form the circuit of FIG. 4. The PLDs being tested by system 26 are not special integrated circuits fabricated specifically for testing, but rather are production parts the same as or similar to those observed to have failed in the field.

As shown in FIG. 4, a first IOB 46 is connected to first microbump 41, and a second IOB 47 is connected to second microbump 42. FIG. 4 shows that first microbump 41 is coupled through package 12 to a first solder ball 48 on the bottom surface of package 12. Second microbump 42 is coupled through package 12 to a second solder ball 49 on the bottom surface of package 12. First solder ball 48 is connected to second solder ball 49 by trace 43 on a printed circuit board 50. If neither first microbump 41 nor second microbump 42 has failed, test signal 44 propagates along a signal path from first IOB 46, through first microbump 41, through first solder ball 48, through trace 43 on printed circuit board 50, through second solder ball 49, through second microbump 42 and to second IOB 47. In the embodiment shown in FIG. 4, second IOB 47 includes pull-down resistor 45. In other embodiments, pull-down resistor 45 is coupled to the signal path of test signal 44 between second microbump 49 and second IOB 47.

Returning to FIG. 3, PLD die 11 of DUT 35 is configured such that flip-flops in the various configurable logic blocks (CLBs) of PLD die 11 are linked together to form one long shift register chain 51 that snakes through PLD die 11. Typically, each CLB has up to eight flip-flops that can be used to build flip-flop chain 51. An additional flip-flop 52 is connected as a toggle and generates a data signal 53 that is supplied to the first flip-flop of chain 51. Additional flip-flop 52 is negative edge triggered, which causes the data value output by each flip-flop of chain 51 to switch each time flip-flop chain 51 is clocked. All of the flip-flops of chain 51 switching their outputs results in a large amount of current being switched by a large number of flip-flops in PLD die 11. Once configured in this fashion, the circuit of FIG. 3 is clocked until each flip-flop in chain 51 toggles its output value each clock cycle.

Figure 5:
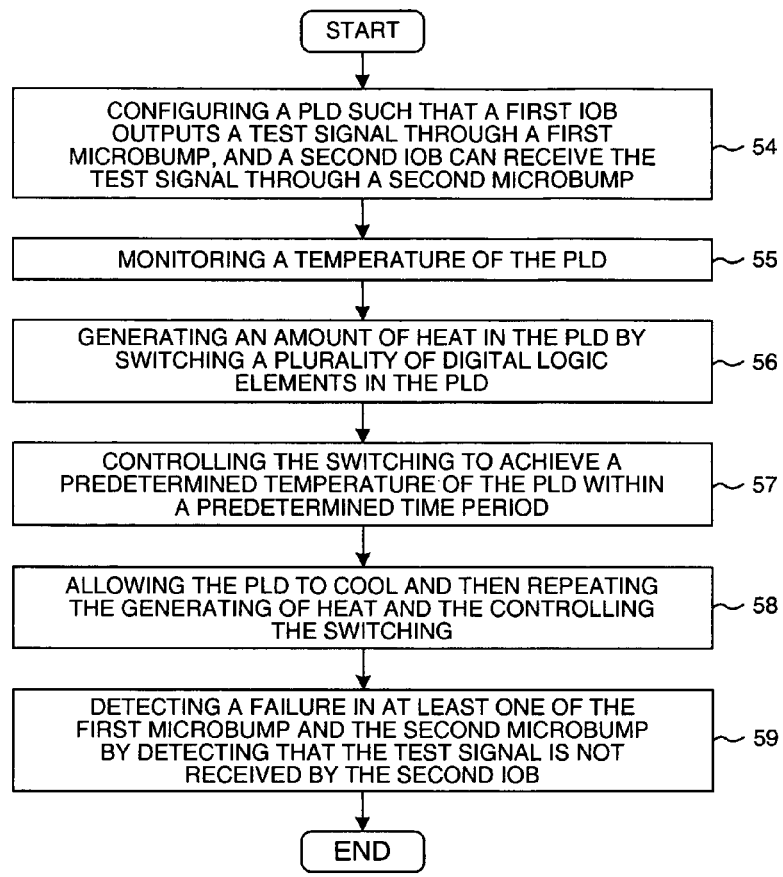
FIG. 5 is a flowchart of steps in a method for replicating thermal cycling in PLDs and for detecting microbump failures in the PLDs.

FIG. 5 is a flowchart that illustrates a method for reproducing the thermal cycling experienced in certain high-throughput applications of PLDs and for detecting the occurrence of microbump failures in the PLDs. FIG. 5 shows steps 54-59 for causing microbump failures by heating the PLDs using supply current received by the PLDs and for detecting and logging the microbump failures. The steps of FIG. 5 will now be described in connection with the circuit of FIGS. 3 and 4.

In a first step 54, PLD die 11 is configured such that first IOB 46 outputs test signal 44 through first microbump 41, and such that second IOB 47 can receive test signal 44 through second microbump 42. PLD die 11 is configured such that test signal 44 can propagate along a signal path from first IOB 46, through first microbump 41, through first solder ball 48, through trace 43 on printed circuit board 50, through second solder ball 49, through second microbump 42 and to second IOB 47.

In a step 55, the temperature of PLD die 11 is monitored by temperature detection IC 36. The temperature data are transmitted in temperature signal 39 to monitor chip 33 and then to controller chip 31. Tester 29 can view the temperature data for DUT 35 and for other DUTs on graphical user interface 30.

In a step 56, heat is generated in PLD die 11 by switching a plurality of digital logic elements in PLD die 11, including the flip-flops in flip-flop chain 51. To begin a rapid temperature increase of a first cycle of thermal cycling, a clock signal 60 is received onto an I/O terminal 61 of PLD die 11 and then supplied flip-flop chain 51. For example, clock signal 60 is a 100 MHz signal. The switching of all of the flip-flops in chain 51 results in a rapid increase in power consumption and, therefore, in a rapid rise in the temperature of PLD die 11. For example, the temperature of PLD die 11 may increase from an ambient temperature of about twenty-five degrees C. to about sixty degrees C. within about two seconds. In other cases, the temperature of PLD die 11 may increase from an ambient temperature of about twenty-five degrees C. to about sixty degrees C. within about sixty seconds.

In a step 57, the switching of the flip-flops in flip-flop chain 51 is controlled to achieve a predetermined temperature of PLD die 11 within a predetermined time period. For example, a sufficient rate of switching of flip-flops in chain 51 is continued until the temperature of PLD die 11 increases to about 105 degrees C. within about five minutes. Furthermore, switching is controlled to maintain a temperature of about 105 degrees C. until the elapse of fifteen minutes from the beginning of the first cycle of thermal cycling.

The amount of switching within a predetermined time period is controlled by varying the duty cycle of a heat control signal 62 output by monitor chip 33. An AND gate 63 receives heat control signal 62 and clock signal 60, and outputs a chain clock signal 64. During the portion of the duty cycle of heat control signal 62 that is a digital high, AND gate 63 passes clock signal 60. The amount of switching within a predetermined time period is increased by increasing the portion of the duty cycle of heat control signal 62 that is at a digital high.

In order to control the switching to maintain a predetermined temperature, temperature detection IC 36 first reports to monitor chip 33 that the temperature of PLD die 11 is approaching or is at the predetermined temperature. Then monitor chip 33 reduces the duty cycle of heat control signal 62 from being at a digital high 100 percent of the time to something less than 100 percent of the time. This reduction in duty cycle reduces the number of clock edges that clock flip-flop chain 51 per unit time. Accordingly, flip-flop chain 51 uses less electrical energy from the supply current received by the PLD, and power consumption is reduced. Monitor chip 33 controls the duty cycle of heat control signal 62 such that the temperature of PLD die 11 is maintained at the predetermined elevated level for the predetermined time period.

In a step 58, PLD die 11 is allowed to cool, and the thermal cycling is repeated. In order to cool PLD die 11, monitor chip 33 deasserts heat control signal 62 to stop the clocking of flip-flop chain 51. Power consumption is thereby reduced, and PLD die 11 cools due to thermal dissipation in an ambient environment. PLD die 11 is allowed to cool for fifteen minutes. In this example, PLD die 11 reaches the ambient temperature of about twenty-five degrees C. in somewhat less than the fifteen-minute cooling period. The heating in step 56 and the switching control in step 57 are then repeated, and a PLD die 11 goes through a second cycle of thermal cycling.

Figure 6:
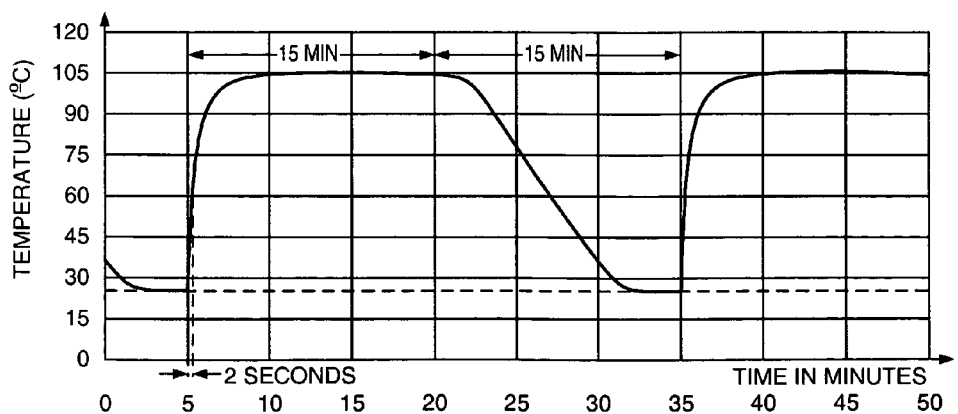
FIG. 6 is a graph of the change in temperature of a PLD over time that is controlled by the system of FIG. 3.

FIG. 6 is a graph showing how the temperature of PLD die 11 changes over time in response to steps 56-58. Each thermal cycle lasts about thirty minutes. Thus, the controlled switching of system 26 self-heats PLD die 11 to replicate the rapid temperature increases and the thermal cycling that are believed to cause microbump failures in certain real-world applications. Due to the self-heating of the PLDs under test, the rate of thermal ramp (for example, sixty degrees C. in two seconds) is much greater than in a conventional thermal cycle test as would typically be conducted on an ASIC in a test oven. The self-heating test therefore more accurately reflects a demanding temperature environment such as those encountered by PLDs in telecommunications applications.

In a step 59 of FIG. 5, system 26 detects a failure in at least one of first microbump 41 and second microbump 42 by detecting that test signal 44 is not received by second IOB 47, as shown in FIG. 4. Data concerning which microbumps have failed are received by monitor chip 33 in a microbump testing signal 65 that is transmitted over a JTAG bus 66. Multiple DUTs are connected to monitor chip 33 in a chain by JTAG bus 66.

Figure 7:
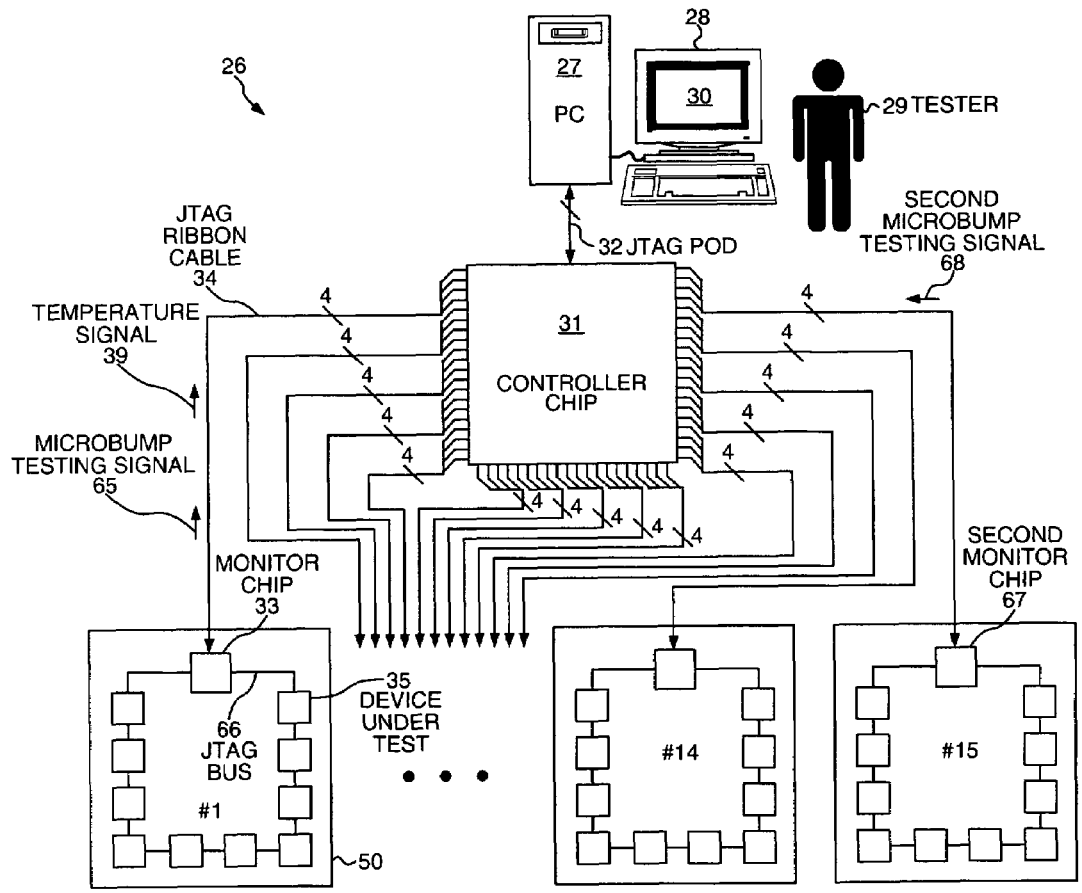
FIG. 7 is a simplified circuit diagram of the system of FIG. 3 in a configuration with fifteen monitor chips that each tests ten devices under test.

FIG. 7 shows an embodiment of system 26 in which one hundred fifty PLDs are simultaneously self heated and tested for microbump failures. Controller chip 31 uses four pins to communicate with a JTAG port on each of fifteen monitor chips. DUT 35 and monitor chip 33 are shown mounted on printed circuit board 50. DUT 35, monitor chip 33, and nine additional DUTs are coupled together in series along JTAG bus 66. A second monitor chip 67 is shown that transmits a second microbump testing signal 68 to controller chip 31. Second microbump testing signal 68 contains microbump failure data relating to the ten DUTs controlled by second monitor chip 67. Microbump failure data for all one hundred fifty DUTs are communicated via JTAG pod 32 back to PC 27, where the data are logged for review and analysis by tester 29.

Figure 8:
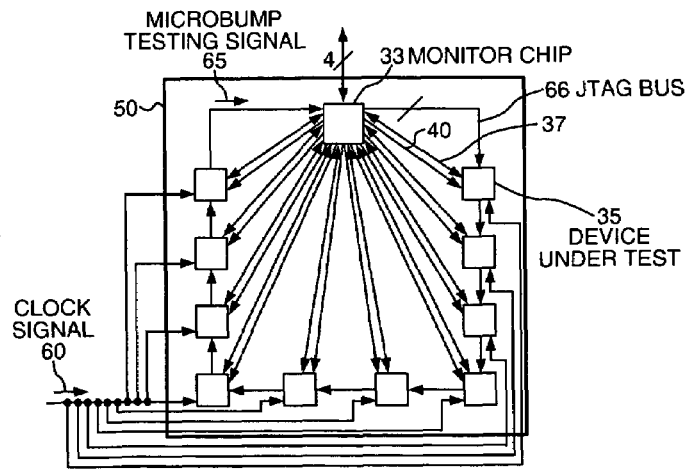
FIG. 8 is a simplified circuit diagram of one monitor chip of FIG. 7 and the associated devices under test.

FIG. 8 shows the ten DUTs and monitor chip 33 on printed circuit board 50 in more detail. Each PLD under test is configured such that substantially all of the microbumps of each PLD are connected in the strap-back manner shown in FIG. 4. Monitor chip 33 reads microbump failure data from all ten DUTs through JTAG bus 66. In addition to temperature bus 37 and heat control line 40 that couple monitor chip 33 to DUT 35, monitor chip 33 is coupled to each of the other nine DUTs by an additional temperature bus and an additional heat control line. Flip-flop chains in each of the ten DUTs are clocked by clock signal 60.

Although the present invention is described in connection with certain specific embodiments for instructional purposes, the present invention is not limited thereto. A method is described above for detecting failures of microbumps on PLDs. The method, however, can also be applied to detecting failures of microbumps on other integrated circuits, such as microprocessors and ASICs. Accordingly, various modifications, adaptations, and combinations of various features of the described embodiments can be practiced without departing from the scope of the invention as set forth in the following claims.

What is claimed is:

1. A method comprising:
    (a) configuring a programmable logic device (PLD) such that a first input/output block (IOB) outputs a test signal through a first microbump, and a second IOB can receive the test signal through a second microbump;
    (b) monitoring a temperature of the PLD;
    (c) generating an amount of heat in the PLD by switching a plurality of digital logic elements in the PLD;
    (d) controlling the switching to achieve a predetermined temperature of the PLD within a predetermined time period; and
    (e) if a failure occurs, detecting the failure in at least one of the first microbump and the second microbump by detecting that the test signal is not received by the second IOB;
    wherein the PLD is a packaged PLD having a first solder ball and a second solder ball, and wherein the test signal follows a signal path from the first IOB, through the first microbump, through the first solder ball, through a trace on a printed circuit board, through the second solder ball, through the second microbump and to the second IOB.

2. The method of claim 1, wherein the PLD includes a pull-down resistor that is coupled to the signal path at a location between the second microbump and the second IOB.

3. The method of claim 1, wherein a signal path extends from the second microbump to the second IOB, wherein a pull-up resistor is coupled to the signal path at a location between the second microbump and the second IOB, wherein the test signal in (a) is communicated along the signal path, and wherein the test signal is a logic low.

4. The method of claim 1, wherein the temperature of the PLD monitored in (b) is less than twenty-five degrees Celsius, and wherein the predetermined temperature of the PLD in (d) is sixty degrees Celsius or greater, and wherein the predetermined time period is two seconds or less.

5. The method of claim 1, wherein the temperature of the PLD monitored in (b) is greater than one hundred five degrees Celsius, wherein the predetermined temperature of the PLD in (d) is thirty degrees Celsius or less, and wherein the predetermined time period is fifteen minutes or less.

6. The method of claim 1, wherein the PLD receives a heat control signal having a duty cycle, and wherein the controlling in (d) is performed by controlling a duty cycle of the heat control signal.

7. The method of claim 1, wherein the PLD includes a package and an integrated circuit, and wherein the integrated circuit is coupled to the package by the first microbump and the second microbump.

8. The method of claim 1, further comprising, after (d) and before (e):
(f) allowing the PLD to cool and then repeating (c) and (d).

9. A method comprising:
(a) configuring a programmable logic device (PLD) such that a first input/output block (IOB) outputs a test signal from a first pad, and such that the test signal can be communicated through a first means for connecting to a first terminal of a package containing the PLD, through a second terminal of the package, and through a second means for connecting to a second pad of a second IOB of the PLD;
(b) monitoring a temperature of the PLD;
(c) generating an amount of heat in the PLD by switching a plurality of digital logic elements in the PLD;
(d) controlling the switching to achieve a predetermined temperature of the PLD within a predetermined time period; and
(e) if a failure occurs, detecting the failure in at least one of the first pad, the first means for connecting, the second means for connecting and the second pad by detecting that the test signal is not received by the second IOB;
wherein the PLD is a packaged PLD having a first solder ball and a second solder ball, and wherein the test signal follows a signal path from the first IOB, through the first microbump, through the first solder ball, through a trace on a printed circuit board, through the second solder ball, through the second microbump and to the second IOB.

10. The method of claim 9, wherein the first means for connecting is taken from the group consisting of: a microbump, and a wire bond, and wherein the second means for connecting is taken from the group consisting of: a microbump, and a wire bond.

11. A system, comprising:
a programmable logic device (PLD) having a first input/output block (IOB), a second IOB, a first microbump, a second microbump and a plurality of digital logic elements, wherein the first microbump is coupled to the second microbump external to the programmable logic device, and wherein the PLD is configured such that the first IOB outputs a test signal through the first microbump and the second IOB can receive the test signal through the second microbump, wherein the PLD has a temperature, and wherein an amount of heat is generated by the plurality of digital logic elements;
a monitor chip that receives a temperature signal indicative of the temperature of the PLD, the monitor chip generating a heat control signal that controls the amount of heat generated by the plurality of digital logic elements, the monitor chip receiving a microbump testing signal from the PLD that is asserted if the second IOB does not receive the test signal; and
wherein the PLD is a packaged PLD having a first solder ball and a second solder ball, and wherein the test signal follows a signal path from the first IOB, through the first microbump, through the first solder ball, through a trace on a printed circuit board, through the second solder ball, through the second microbump and to the second IOB.

12. The system of claim 11, wherein the test signal is not received by the second IOB when any of the first microbump and the second microbump fails.

13. The system of claim 11, wherein the PLD includes a temperature detector that detects the temperature of the PLD, and wherein the monitor chip receives the temperature signal from the temperature detector.

14. The system of claim 11, wherein the first microbump is coupled to the second microbump through a trace on a printed circuit board.

15. The system of claim 11, further comprising:
a temperature detection integrated circuit that detects the temperature of the PLD, wherein the monitor chip receives the temperature signal from the temperature detection integrated circuit.

16. The system of claim 11, further comprising:
a JTAG bus coupled to the monitor chip and to the PLD, wherein the monitor chip receives the microbump testing signal over the JTAG bus.

17. The system of claim 11, further comprising:
a second monitor chip; and
a controller chip coupled to the monitor chip and to the second monitor chip, wherein the controller chip receives the microbump testing signal from the monitor chip, and wherein the controller chip receives a second microbump testing signal from the second monitor chip.

18. The system of claim 11, wherein a pull-down resistor is coupled to a signal path between the second microbump and the second IOB.

19. A system, comprising:
a first microbump of a programmable logic device (PLD), the PLD receiving a supply current and having a first input/output block (IOB) and a second IOB;

a second microbump of the PLD, the second microbump coupled to the first microbump over a signal path that is external to the PLD;

means for causing a failure of at least one of the first microbump and the second microbump by heating the PLD using electrical energy of the supply current received by the PLD;

means for detecting the failure of at least one of the first microbump and the second microbump; and wherein the PLD is a packaged PLD having a first solder ball and a second solder ball, and wherein the test signal follows a signal path from the first IOB, through the first microbump, through the first solder ball, through a trace on a printed circuit board, through the second solder ball, through the second microbump and to the second IOB.

20. The system of claim 19, wherein the means for detecting the failure detects whether any of the first microbump and the second microbump is cracked.

21. The system of claim 19, wherein the means for detecting the failure transmits a microbump testing signal indicative of the failure over a JTAG bus.

22. The system of claim 19, wherein the means for causing a failure comprises a plurality of digital logic elements.

* * * * *